(12) United States Patent
Chiu et al.

(10) Patent No.: US 9,107,017 B1
(45) Date of Patent: Aug. 11, 2015

(54) ETCHING METHOD FOR MANUFACTURING MEMS DEVICE

(71) Applicant: UNITED MICROELECTRONICS CORPORATION, Hsinchu (TW)

(72) Inventors: Yu-Hsiang Chiu, Taichung (TW); Jeng-Ho Wang, Hsinchu (TW); Hsin-Yi Lu, Zhubei (TW); Chang-Sheng Hsu, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 14/316,769

(22) Filed: Jun. 26, 2014

(30) Foreign Application Priority Data

Jun. 3, 2014 (CN) .......................... 2014 1 0241849

(51) Int. Cl.
*H01L 21/3065* (2006.01)
*H04R 31/00* (2006.01)
*H01L 21/304* (2006.01)

(52) U.S. Cl.
CPC ............ *H04R 31/003* (2013.01); *H01L 21/304* (2013.01); *H01L 21/3065* (2013.01)

(58) Field of Classification Search
CPC .................................................. H01L 21/3213
See application file for complete search history.

(56) References Cited

U.S. PATENT DOCUMENTS 8,643,129 B2    2/2014   Laming et al.

*Primary Examiner* — Cheung Lee
(74) *Attorney, Agent, or Firm* — Ding Yu Tan

(57) ABSTRACT

An etching method for manufacturing MEMS devices is provided. The method includes steps of: providing a substrate including a first surface and a second surface opposite to the first surface, wherein a base structure, a sacrificial structure and at least one adhesion layer are arranged on the first surface of the substrate, the adhesion layer is disposed between the base structure and the sacrificial structure, the base structure is disposed between the adhesion layer and the substrate; performing a surface grinding process on the second surface of the substrate; performing a first plasma etching process by using a first mixed gas to remove the sacrificial structure, wherein the first mixed gas includes oxygen and a first nitrogen-based gas; and performing a second plasma etching process by using a second mixed gas to remove the adhesion layer, wherein the second mixed gas includes a second nitrogen-based base gas and a fluorine-based gas.

12 Claims, 12 Drawing Sheets

ETCHING METHOD FOR MANUFACTURING MEMS DEVICE

FIELD OF THE INVENTION

The present invention relates to an etching method for manufacturing MEMS devices, and more particularly to a plasma etching method for manufacture MEMS devices.

BACKGROUND OF THE INVENTION

Microphones are widely applied in daily life devices configured to convert the received voice into the electrical signals, such as cell phones, voice recorder, telephone, interphone, and headset. Comparing to conventional microphones, the microphones manufactured by a semiconductor process have many behaviors of miniaturization, energy-saving and multifunction, etc. Moreover, a miniature microphone and an analog amplification circuit packaged to form single MEMS microphone product are prevalent in current market.

There are three common types of MEMS microphone including piezoelectric MEMS microphones, piezoresistive MEMS microphones, and capacitive MEMS microphones, wherein the piezoelectric MEMS microphone and the piezoresistive MEMS microphone are lower in sensitivity to sound pressure and have larger system noises. So now the capacitive MEMS microphones having higher sensitivity and lower power consumption characteristics are becoming the more predominant mainstream MEMS microphone development in current market.

Please refer to FIG. 1. The capacitive MEMS microphone 100 includes a substrate 101, a membrane 110, a backplate 120 having porous structure, and an insulating air layer 130 disposed between the membrane 110 and the backplate 120. The membrane 110 and the backplate 120 are configured to serve as a conductive plate. The capacitive MEMS microphone 100 is configured to convert sound into voltage, and the conversion principle is described as follows: the membrane 110 is vibrated by the sound pressure, wherein the vibration of the membrane 110 will bring a dynamic micro-displacement between the membrane 110 and the backplate 120 to change a capacitance value of the capacitive MEMS microphone 100, and the changed capacitance value will be converted into voltage. Moreover, the insulating air layer 130 arranged between the membrane 110 and the backplate 120 is configured to prevent charges from accumulating in the capacitive MEMS microphone 100.

However, it is difficult for conventional process for manufacturing MEMS microphones to completely remove a sacrificial layer originally located at the same position of the insulating air layer 130 and form the clearly defined (and properly formed) insulating air layer 130. But if the residues of the sacrificial layer are remained between the membrane 110 and the backplate 120, then the residues will result in a reduced reliability of the capacitive MEMS microphone and result in higher power consumption.

In view of the aforementioned reasons, there is need to provide a new method for manufacturing MEMS microphones to solve the above mentioned problems resulted from the residues of the sacrificial layer.

SUMMARY OF THE INVENTION

The present invention provides an etching method for manufacturing MEMS devices, so as to enhance the yield of the MEMS devices after experiencing the etching process.

In order to achieve the aforementioned advantages or other merits, an etching method for manufacturing MEMS devices is provided in an embodiment of the present invention. The method includes steps of providing a substrate including a first surface and a second surface opposite to the first surface, wherein a base structure, a sacrificial structure and at least one adhesion layer are arranged on the first surface of the substrate, the adhesion layer is disposed between the base structure and the sacrificial structure, the base structure is disposed between the adhesion layer and the substrate; performing a surface grinding process on the second surface of the substrate; performing a first plasma etching process by using a first mixed gas to remove the sacrificial structure, wherein the first mixed gas includes oxygen and a first nitrogen-based gas; and performing a second plasma etching process by using a second mixed gas to remove the adhesion layer, wherein the second mixed gas includes a second nitrogen-based gas and a fluorine-based gas.

In an embodiment of the present invention, the sacrificial structure has a material of Polyimide.

In an embodiment of the present invention, the adhesion layer has a material of organosilane.

In an embodiment of the present invention, the first nitrogen-based gas and the second nitrogen-based gas are gases respectively selected from at least one a nitrogen gas, nitrogen hydrides and a mixture thereof.

In an embodiment of the present invention, nitrogen hydride is a gas selected from a group including $N_2H_2$, $N_2H_4$, $N_2H_6$, and $NH_3$.

In an embodiment of the present invention, the fluorine-based gas has a composition of fluorocarbon.

In an embodiment of the present invention, the fluorine-based gas is a gas selected from a group including carbon tetrafluoride ($CF_4$), octafluorocyclobutane ($C_4F_8$) or octafluorocyclopentene ($C_5F_8$) and a mixture thereof.

In an embodiment of the present invention, a ratio of the second nitrogen-based gas to the fluorine-based gas ranges from 99:1 to 2:1.

In an embodiment of the present invention, a ratio of oxygen to the first nitrogen-based gas of the first mixed gas ranges from 1:5 to 1:30.

In an embodiment of the present invention, the etching method further includes performing a backside etching process on the second surface to form a recess after performing the surface grinding process on the second surface of the substrate, and then performing the first plasma etching process to remove the sacrificial structure.

In an embodiment of the present invention, the sacrificial structure is a sandwich structure.

In an embodiment of the present invention, wherein the at least one adhesion layer is a plurality of adhesion layers, the base structure includes a bottom layer, an intermediate layer, and a surface layer, the bottom layer is in contact with the first surface, the intermediate layer includes at least one through hole, the surface layer includes a plurality of through holes and discontinuous strip parts, the sacrificial structure is disposed between the bottom layer and the intermediate layer and between the surface layer and the intermediate layer, as well as further arranged in the through holes and arranged to cover the surface layer to form a sandwich structure, the adhesion layers are disposed between the sacrificial structure and a surface of the bottom layer away from the first surface, and between the sacrificial structure and a surface of the intermediate layer away from the first surface, as well as disposed between the sacrificial structure and a surface of the surface layer away from the first surface, respectively.

In summary, according to the etching method for manufacturing MEMS devices provided in the present invention, the plasma including the first mixed gas including 02 and the nitrogen-based gas (e.g. $N_2H_2$) is used for etching the sacrificial structure made from Polyimide, and the plasma including the second mixed gas including the nitrogen-based gas (e.g. $N_2H_2$) and the fluorine-based gas (e.g. $CF_4$) is used for etching the adhesion layer made from Organosilane, so as to effectively remove Polyimide and Organosilane and prevent the residues thereof from remaining on the base structure and reducing the yield of the MEMS devices.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 2A~2E schematically illustrate an etching process flow for manufacturing MEMS devices in accordance with an embodiment of the present invention. Please refer to FIG. 2A. The etching method for manufacturing MEMS devices includes steps of: providing a substrate 210 firstly, wherein the substrate 210 includes a first surface S1 and a second surface S2 opposite to the first surface S1. Moreover, a base structure 220, a sacrificial structure 230 and at least one adhesion layer 240 are arranged on the first surface S1 of the substrate 210. The base structure 220 is, for example, in direct contact with the first surface S1 of the substrate 210, wherein a surface of the base structure 220 away from the first surface S1 is an uneven surface S3. Besides, the base structure 220 includes a top electrode and a bottom electrode (not shown in figures), for example. The base structure 220 is disposed between the adhesion layer 240 and the substrate 210. The adhesion layer 240 is disposed between the base structure 220 and the sacrificial structure 230, wherein the adhesion layer 240 has a thickness ranged from about several angstroms to several nanometers, such as 5 nm~9 nm. The adhesion layer 240 is configured to enhance an adhesion force between the base structure 220 and the sacrificial structure 230.

Figure 1:
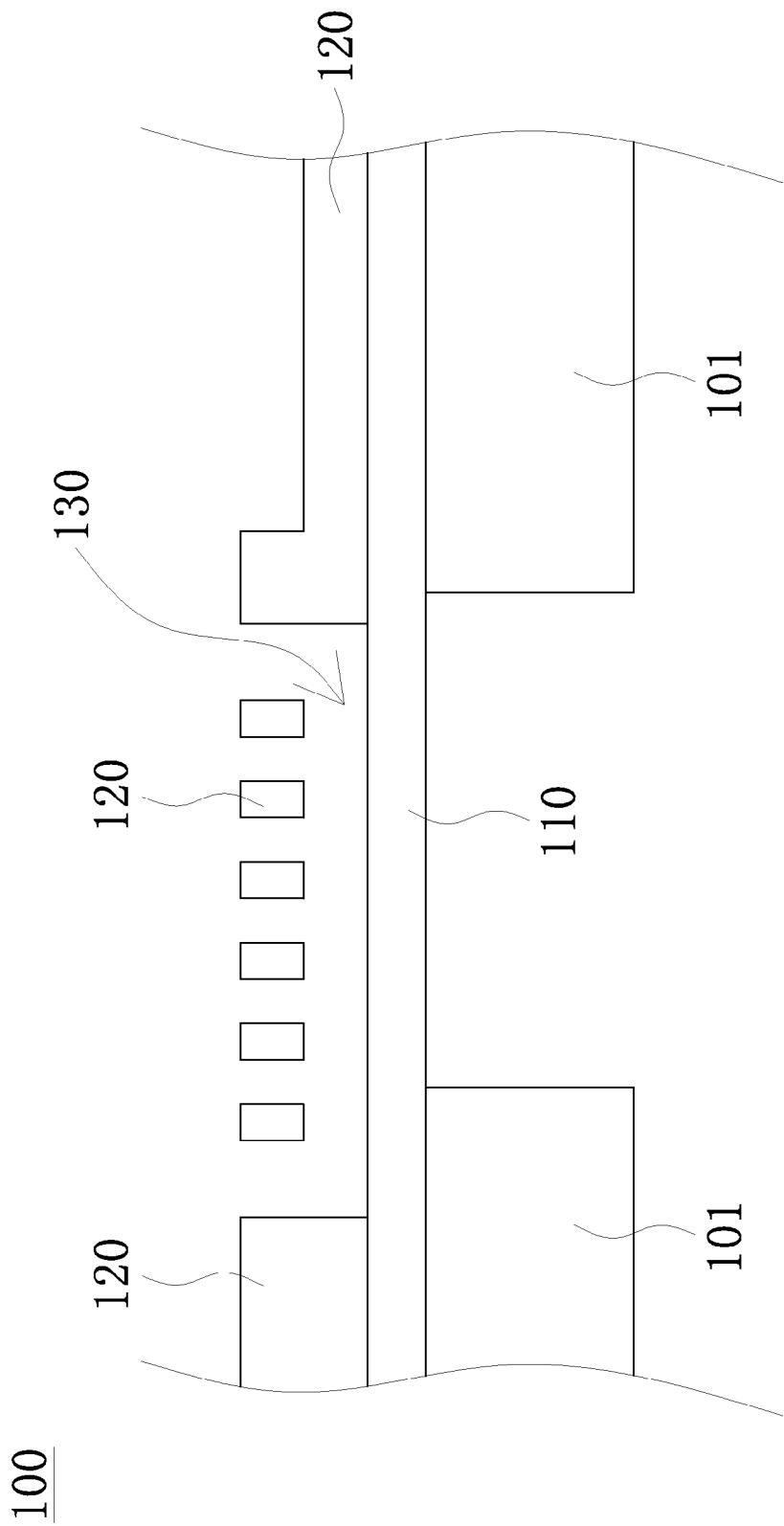
FIG. 1 is a schematic diagram of a conventional capacitive MEMS microphone.
Figure 2A:
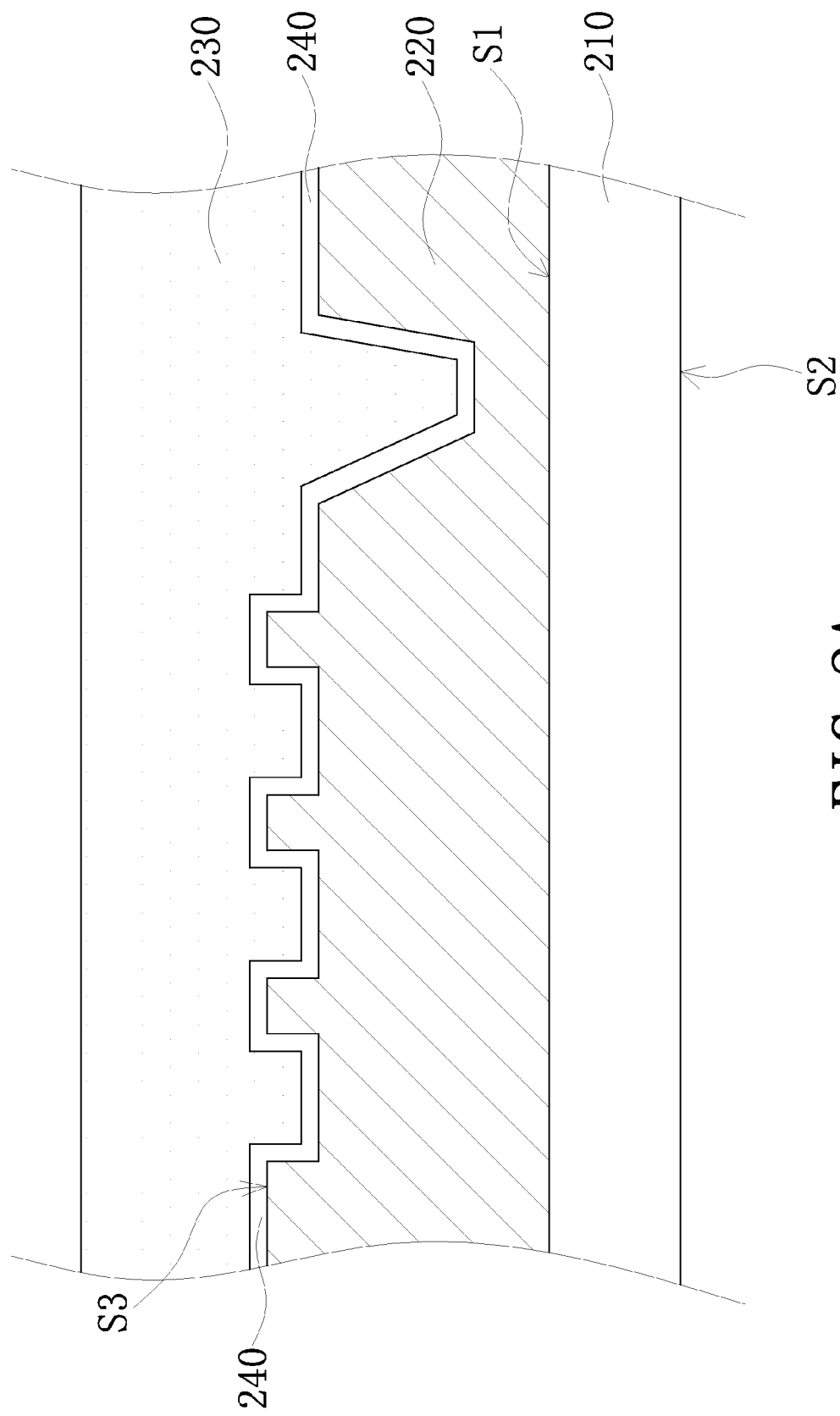
FIGS. 2A~2E schematically illustrate an etching process flow for manufacturing MEMS devices in accordance with an embodiment of the present invention.
Figure 2B:
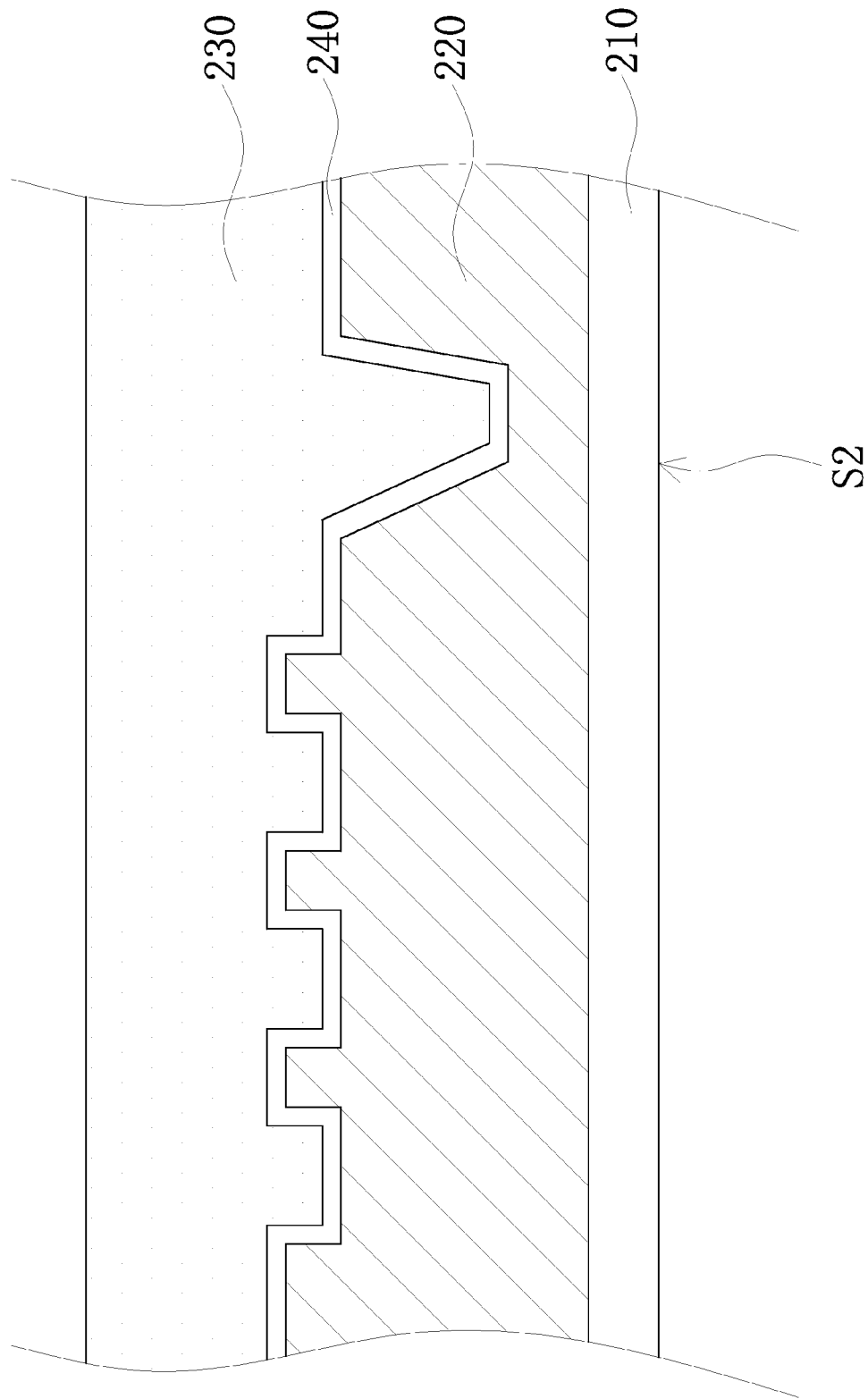

Please refer to FIG. 2B. The next step includes performing a surface grinding process (also named backside grinding process) on the second surface S2 of the substrate 210 to cut down on the thickness of the substrate 210. In the surface grinding process, abrasive particles or slurry may damage the uneven surface S3 of the base structure 220, so covering the sacrificial structure 230 on the base structure 220 can prevent the base structure 220 from being damaged in the surface grinding process.

Figure 2C:
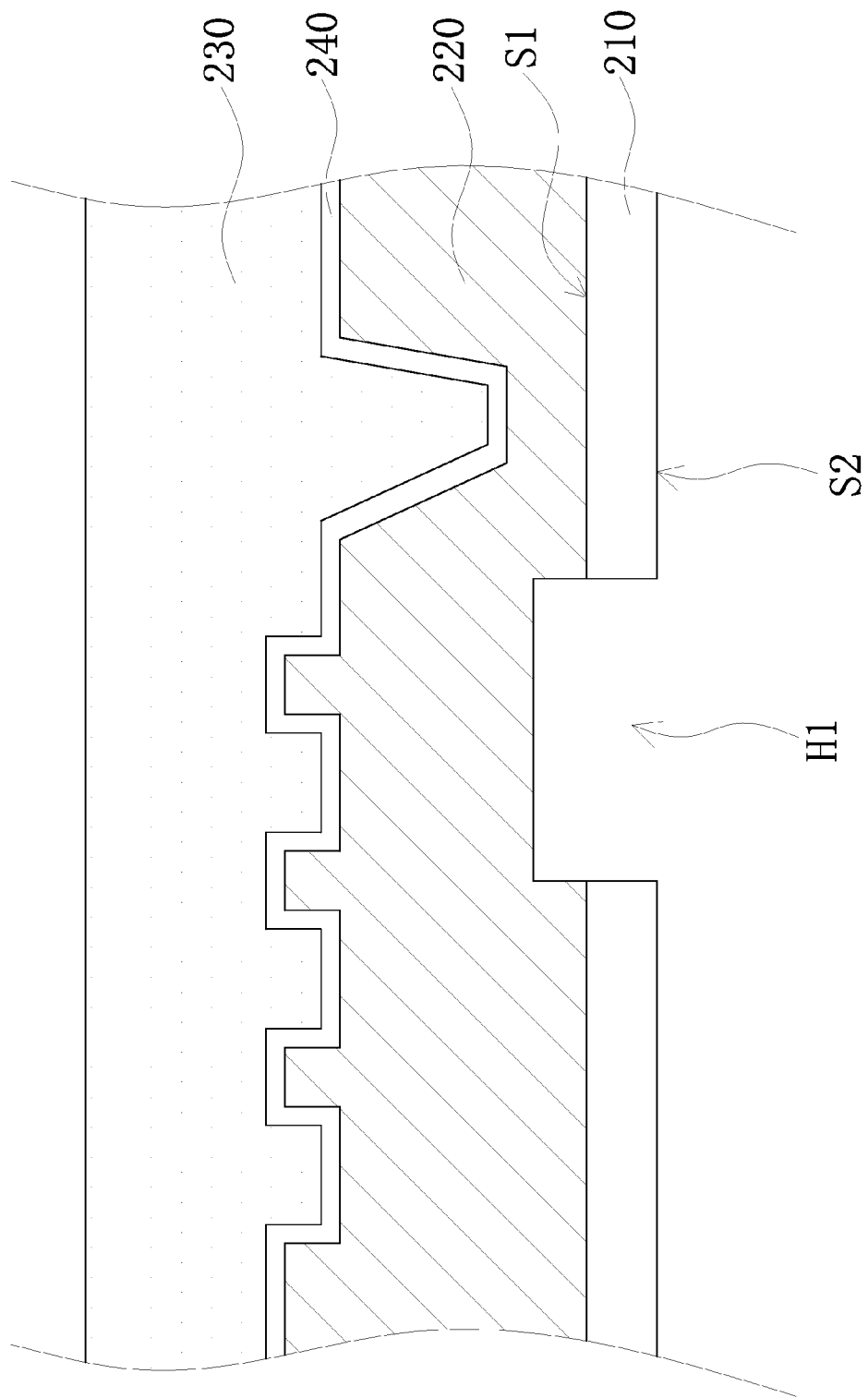

Please refer to FIG. 2C. After completing the surface grinding process, the etching method further includes a step of performing a backside etching process on the second surface S2 of the substrate 210 to form a recess H1, wherein the recess H1 penetrates through the second surface S2 and the first surface S1 to expose a portion of the base structure 220, as shown in FIG. 2C.

Figure 2D:
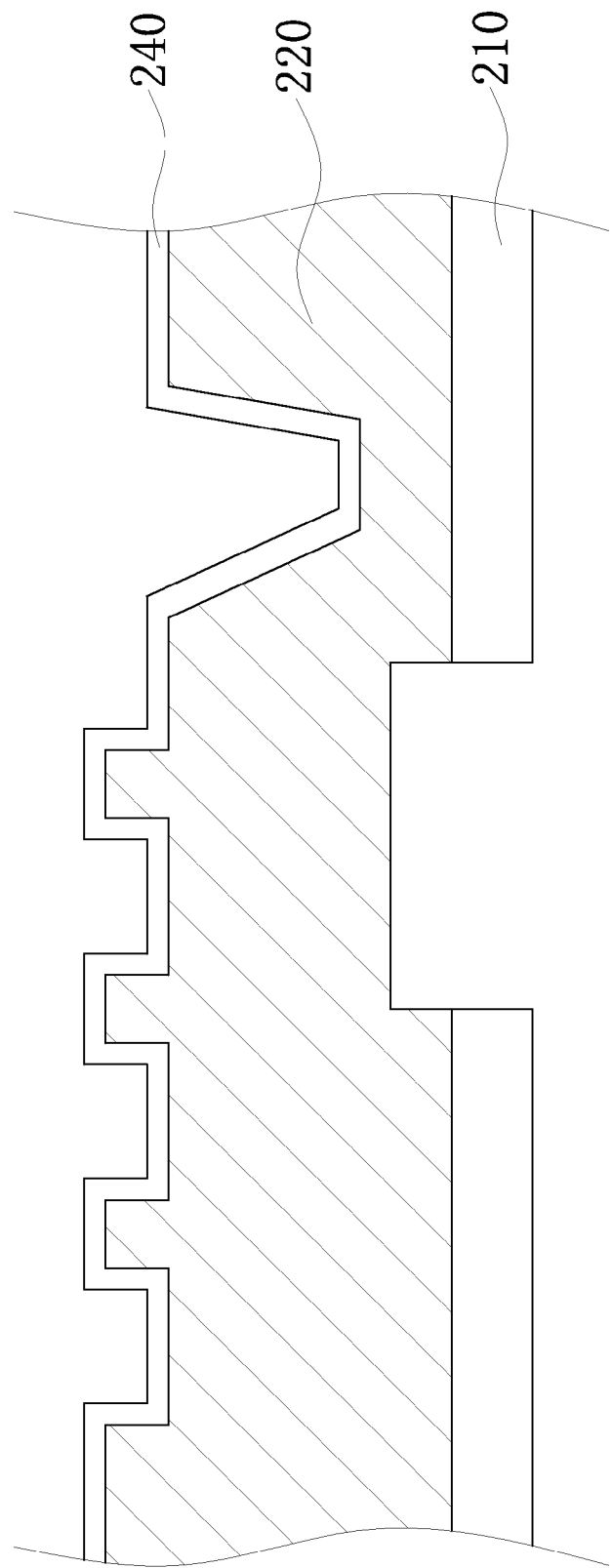

Please refer to FIGS. 2C~2D at the same time. After completing the backside etching process, the etching method further includes a step of performing a first plasma etching process by using a first mixed gas to remove the sacrificial structure 230, wherein the first mixed gas includes oxygen ($O_2$) and a first nitrogen-based gas. The sacrificial structure 230 has a material of Polyimide. The first nitrogen-based gas is a gas selected from a group including a nitrogen gas, nitrogen hydrides and a mixture thereof. Nitrogen hydride is a gas selected from a group including $N_2H_2$, $N_2H_4$, $N_2H_6$, and $NH_3$. $N_2H_2$ is made from a mixture of $N_2$ gas and $H_2$ gas, wherein volume ratio of $H_2$ gas to $N_2$ gas is about 6%~7%.

Figure 2E:
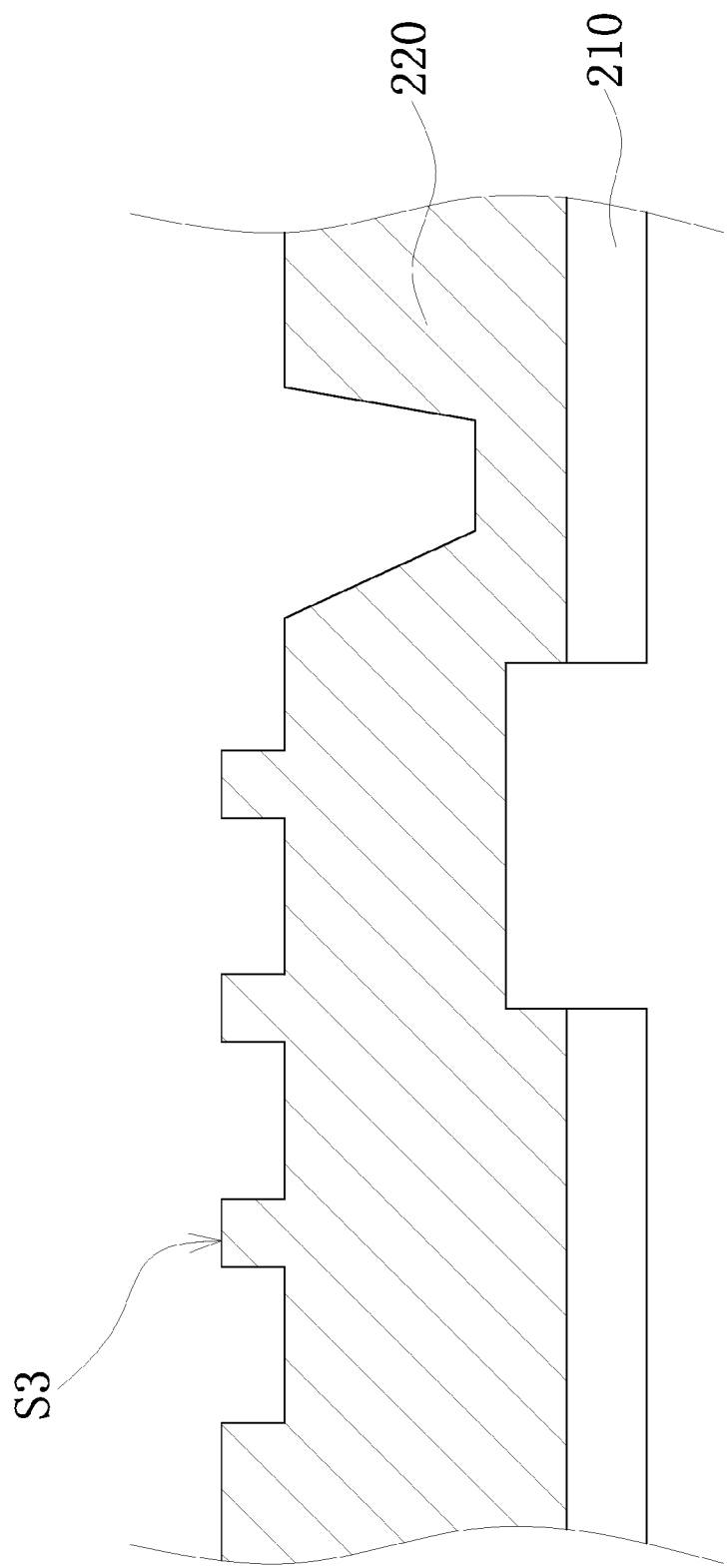

Please refer to FIGS. 2D~2E at the same time. After removing the sacrificial structure 230, the etching method further includes a step of performing a second plasma etching process by using a second mixed gas including a second nitrogen-based gas and a fluorine-based gas to remove the adhesion layer 240 and then expose the uneven surface S3 of the base structure 220, as shown in FIG. 2E. The adhesion layer 240 has a material of organosilane. Organosilane are presented in liquid form, not sticky form. So the adhesion layer 240 has a limited thickness about 5 nm~9 nm. The second nitrogen-based gas is a gas selected from a group including a nitrogen gas, nitrogen hydrides and a mixture thereof, wherein nitrogen hydride is a gas selected from a group including $N_2H_2$, $N_2H_4$, $N_2H_6$, and $NH_3$. The fluorine-based gas has a composition of fluorocarbon. Or in other embodiment, the fluorine-based gas is a gas selected from a group including carbon tetrafluoride ($CF_4$), octafluorocyclobutane ($C_4F_8$) or octafluorocyclopentene ($C_5F_8$) and a mixture thereof.

It is worth mentioning that, depending on a process requirement, after completing the surface grinding process (also named backside grinding process) shown in FIG. 2B, the etching method may further includes a step of forming a photoresist layer (not shown in figures) on the second surface S2 of the substrate 210, then performing the backside etching process on the photoresist layer and the second surface S2 of the substrate 210, and then performing the first plasma etching process on the sacrificial structure 230 and the photoresist layer simultaneously. Depending on other process requirement, the backside etching process may be omitted, while the first plasma etching process may be directly performed on the sacrificial structure 230 or on the sacrificial structure 230 and the photoresist layer, and then the second plasma etching process is performed on the adhesion layer 240. The steps of the etching method for manufacturing MEMS devices described in the present invention is not to be limited to those shown in the FIGS. 2A~2E.

FIGS. 3A~3E schematically illustrate an etching process flow for manufacturing MEMS devices in accordance with another embodiment of the present invention. The etching method for manufacturing MEMS devices can not only be used for etching MEMS devices including a sacrificial structure arranged on a surface layer (as shown in FIG. 2A), but also be used for etching MEMS devices including a sacrificial structure with a sandwich structure. Please refer to FIG. 3A. The etching method for manufacturing MEMS devices includes steps of: providing a substrate 310, wherein the substrate 310 includes a first surface S1 and a second surface S2 opposite to the first surface S1. Moreover, a base structure 320, a sacrificial structure 330 and a plurality of adhesion layers 341, 343, 345 are arranged on the first surface S1 of the substrate 310.

Figure 3A:
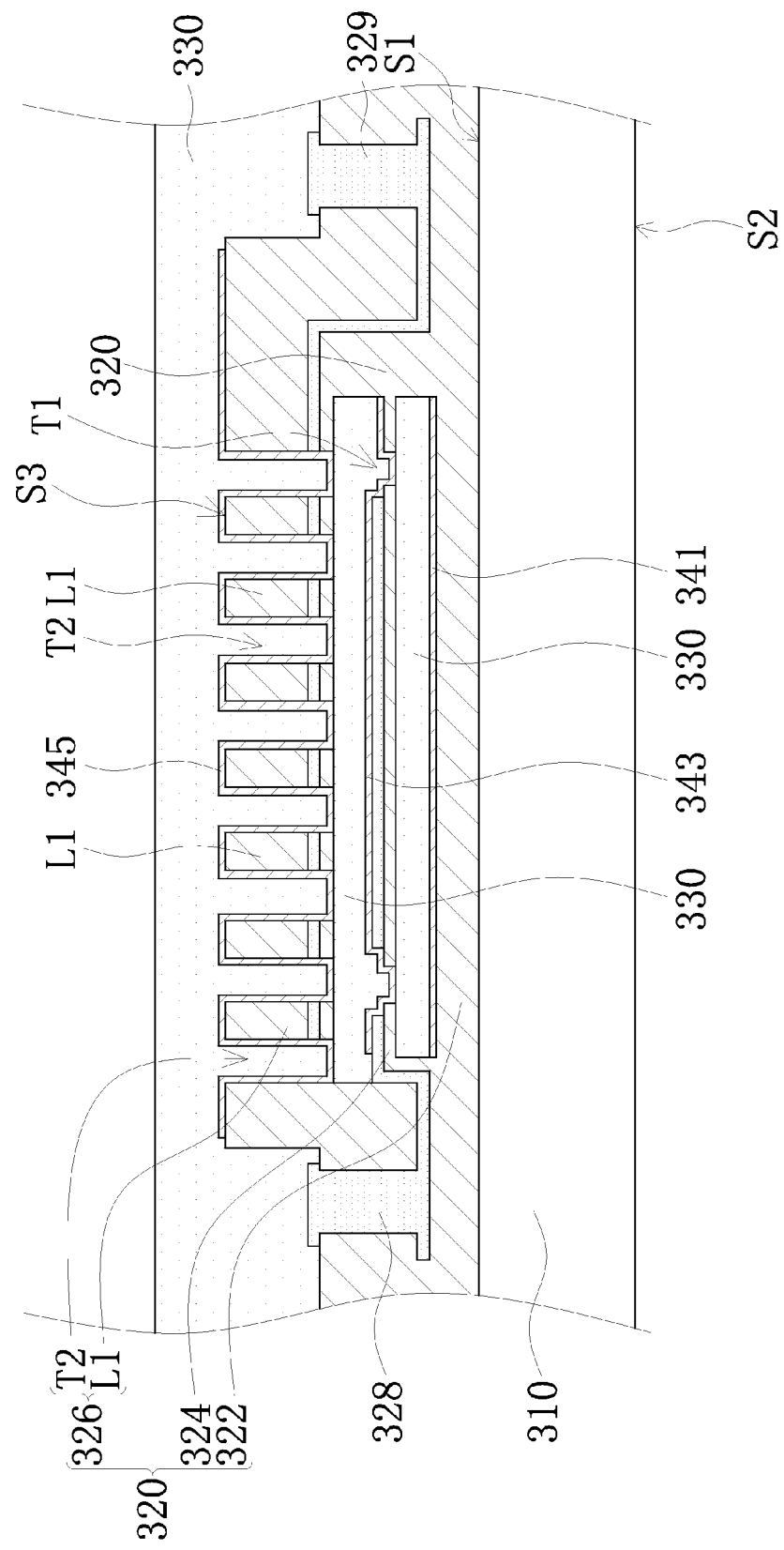
FIGS. 3A~3E schematically illustrate an etching process flow for manufacturing MEMS devices in accordance with another embodiment of the present invention.

Please continue referring to FIG. 3A. The base structure 320 is in direct contact with the first surface S1 of the substrate 310, and a surface of the base structure 320 away from the first surface S1 is an uneven surface S3, for instance. Moreover, the base structure 320 further includes a bottom layer 322, an intermediate layer 324, a surface layer 326, and a plurality of electrodes 328, 329. The bottom layer 322 is in contact with the first surface S1. The intermediate layer 324 has at least one through hole T1. The surface layer 326 includes a plurality of through holes T2 and a plurality of discontinuous strip parts L1. The electrode 328 is electrically connected to the intermediate layer 324, and the electrode 329 is electrically connected to the surface layer 326. The sacrificial structure 330 is disposed between the bottom layer 322 and the intermediate layer 324 and between the surface layer 326 and the intermediate layer 324, as well as further arranged in the through holes T2, T1 and arranged to cover the surface layer 326 to form the sacrificial structure being a sandwich structure. The adhesion layers 341, 343, 345 are respectively disposed between the sacrificial structure 330 and a surface of the bottom layer 322 away from the first surface S1, and between the sacrificial structure 330 and a surface of the intermediate layer 324 away from the first surface S1, as well as disposed between the sacrificial structure 330 and a surface of the surface layer 326 away from the first surface S1, so as to enhance an adhesion force between the base structure 320 and the sacrificial structure 330. The adhesion layers 341, 343, 345 respectively have thicknesses ranged from about several angstroms to several nanometers, such as 5 nm~9 nm.

Figure 3B:
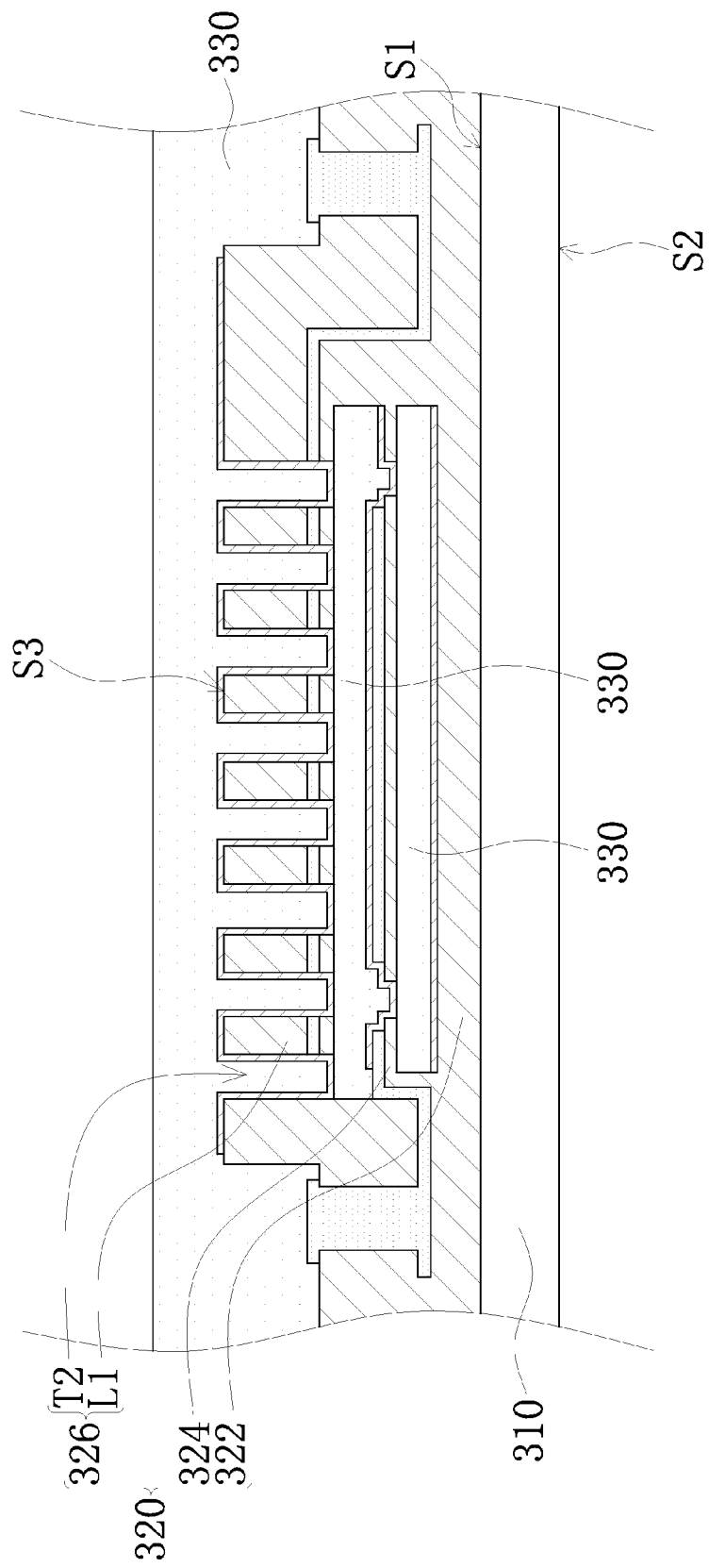

Please refer to FIG. 3B. The next step includes performing a surface grinding process (also named backside grinding process) on the second surface S2 of the substrate 310 to cut down the thickness of the substrate 310. In the surface grinding process, abrasive particles or slurry may damage the uneven surface S3 of the base structure 320, so covering the sacrificial structure 330 on the base structure 320 and filling the sacrificial structure 330 in the base structure 320 can prevent the base structure 320 from being damaged in the surface grinding process.

Figure 3C:
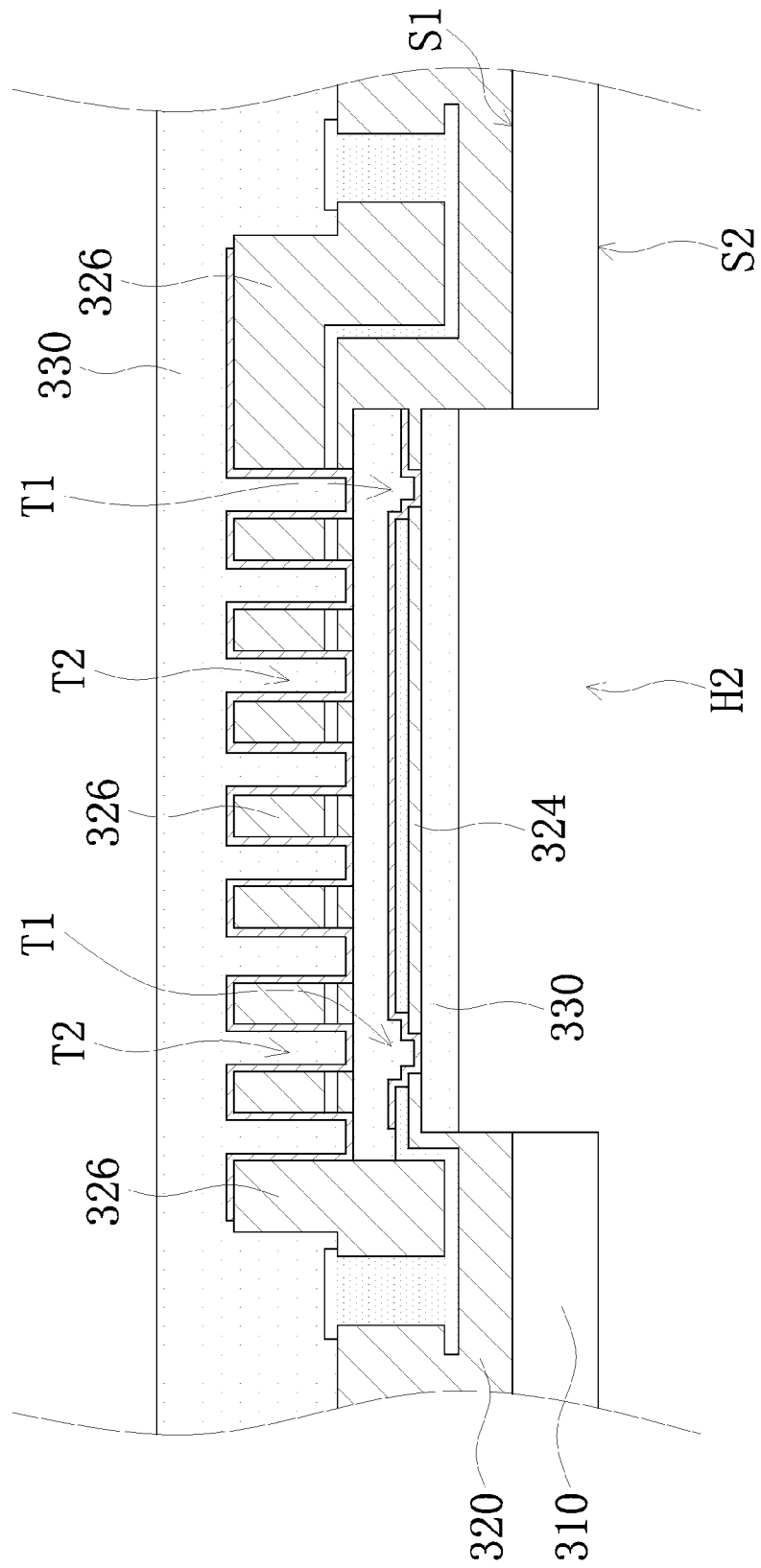

Please refer to FIGS. 3B-3C at the same time. After completing the surface grinding process, the etching method further includes a step of performing a backside etching process on the substrate 310 and on the base structure 320 to form a recess H2, wherein the recess H2 penetrates through the substrate 310, the bottom layer 322 of the base structure 320 and the adhesion layer 341 to expose the sacrificial structure 330 originally disposed between the bottom layer 322 and the intermediate layer 324, as shown in FIG. 3C.

Figure 3D:
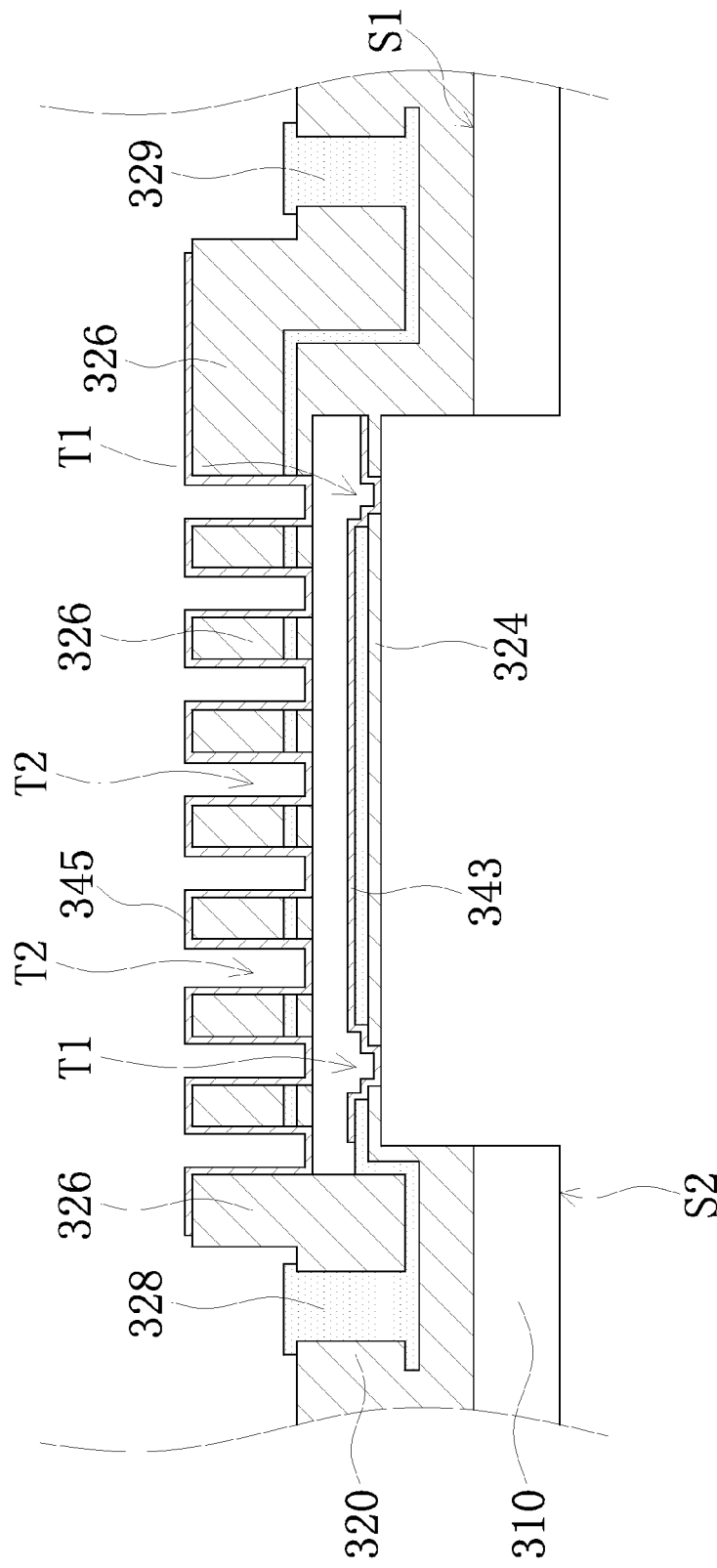

Please refer to FIGS. 3C~3D at the same time. After completing the backside etching process as shown in FIG. 3C, the etching method further includes a step of performing a first plasma etching process by using a first mixed gas including oxygen ($O_2$) and a first nitrogen-based gas to remove the sacrificial structure 330 covering on the base structure 320 and the electrodes 328, 329, disposed between the intermediate layer 324 and the surface layer 326, disposed between the bottom layer 322 and the intermediate layer 324, and disposed in the through holes T1, T2. The sacrificial structure 330 has a material of Polyimide. The first nitrogen-based gas is a gas selected from a group including a nitrogen gas, nitrogen hydrides and a mixture thereof. Nitrogen hydride is a gas selected from a group including $N_2H_2$, $N_2H_4$, $N_2H_6$, and $NH_3$.

Figure 3E:
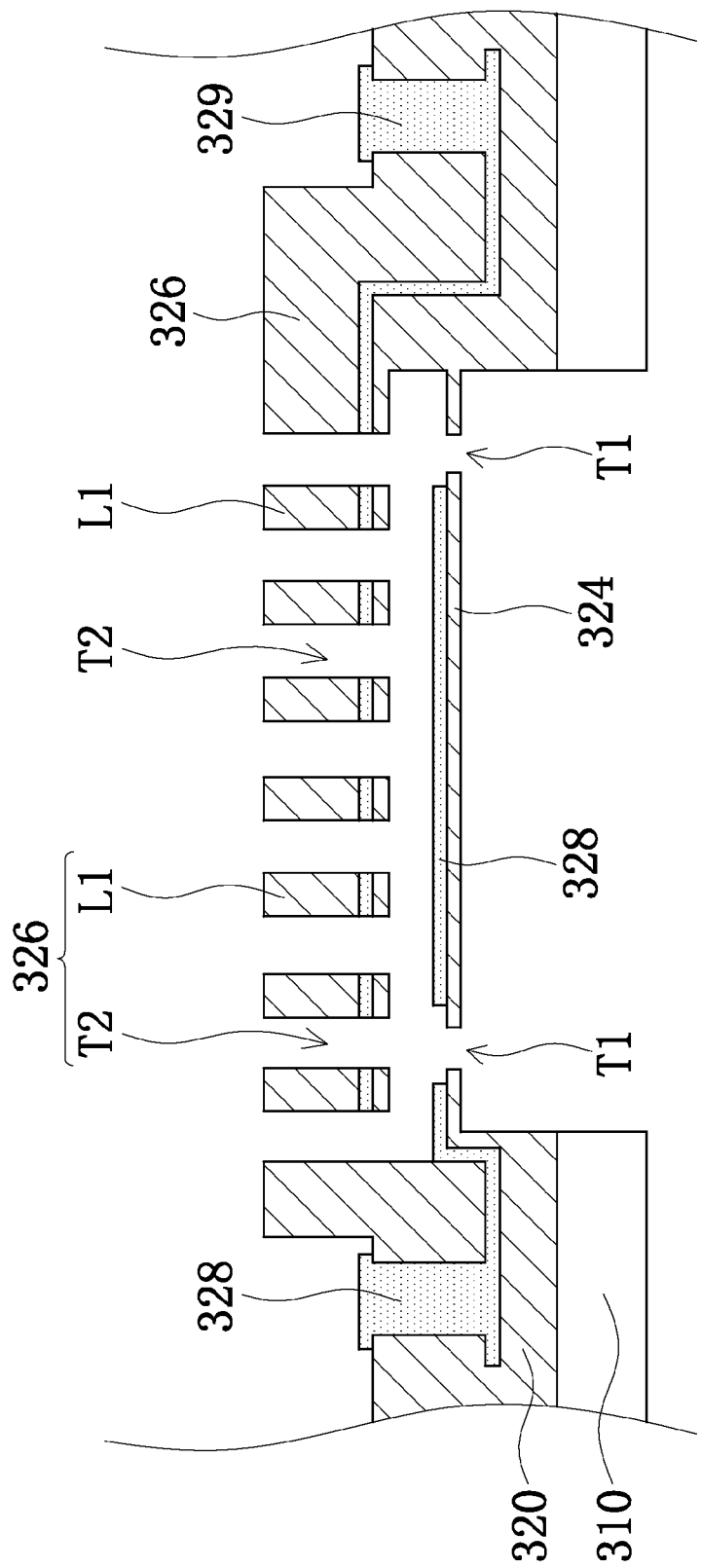

Please refer to FIGS. 3D~3E at the same time. After removing the sacrificial structure 330, the etching method further includes a step of performing a second plasma etching process by using a second mixed gas including a second nitrogen-based base gas and a fluorine-based gas to remove the adhesion layers 343, 345 and then expose the intermediate layer 324 and the surface layer 326 of the base structure 320, as well as expose the strip parts L1 of the surface layer 326, and expose the through holes T2, T1 and portions of the electrodes 328, 329, as shown in FIG. 3E. The adhesion layer 343, 345 have a material of organosilane. The second nitrogen-based gas is a gas selected from a group including a nitrogen gas, nitrogen hydrides and a mixture thereof, wherein nitrogen hydride is a gas selected from a group including $N_2H_2$, $N_2H_4$, $N_2H_6$, and $NH_3$. The fluorine-based gas has a composition of fluorocarbon. Or in other embodiment, the fluorine-based gas is a gas selected from a group including carbon tetrafluoride ($CF_4$), octafluorocyclobutane ($C_4F_8$) or octafluorocyclopentene ($C_5F_8$) and a mixture thereof.

It is worth mentioning that, depending on a process requirement, after completing the surface grinding process (also named backside grinding process) shown in FIG. 3B, the etching method may further includes a step of forming a photoresist layer (not shown in figures) on the second surface S2 of the substrate 310, then performing the backside etching process on the photoresist layer and the second surface S2 of the substrate 310, and then performing the first plasma etching process on the sacrificial structure 330 and the photoresist layer simultaneously. Depending on other process requirement, the backside etching process may be omitted, while the first plasma etching process may be directly performed on the sacrificial structure 330 or on the sacrificial structure 330 and the photoresist layer, and then the second plasma etching process is performed on the adhesion layers 343, 345. The steps of the etching method for manufacturing MEMS devices described in the present invention is not to be limited to those shown in the FIGS. 3A~3E.

It is worth noting that although the sacrificial structures 230, 330 made of polyimide can be removed by the plasma only including oxygen, but the present invention discloses that the plasma simultaneously including oxygen and $N_2H_2$ can be used for etching and removing the sacrificial structures 230, 330 made of polyimide more effectively. So an etching efficiency, an etching uniformity and cleanliness after etching can be enhanced. Moreover, nitrogen hydrides, such as $N_2H_4$, $N_2H_6$, or $NH_3$, can be used for replacing the $N_2H_2$ in accordance with a process requirement. Therefore, a ratio of oxygen of the first mixed gas used in the first plasma etching process to the first nitrogen-based gas ranges from 1:5 to 1:30.

In addition, if the material of the adhesion layers 240, 341, 343, 345 is organosilane, then organosilane will become Si—O bond compounds in an environment including $O_2$ plasma. In other words, the plasma only including oxygen gas can be used for partial etching and remove the adhesion layers 240, 341, 343, 345 made of organosilane. But the plasma including fluorine-based gases can be used for effective and complete etching and removing of the adhesion layers 240, 341, 343, 345 made of organosilane currently. However, since the adhesion layers 240, 341, 343, 345 have very thin thicknesses ranged from about several angstroms to several nanometers, such as 5 nm~9 nm, so the plasma only including the fluorine-based gases used for etching the adhesion layers 240 having too thin thicknesses will result in too fast etching rate and thus an action time for etching the adhesion layer 240 are difficult to be controlled to avoid damaging the base structure 220 beneath the adhesion layer 240.

Figure 4:
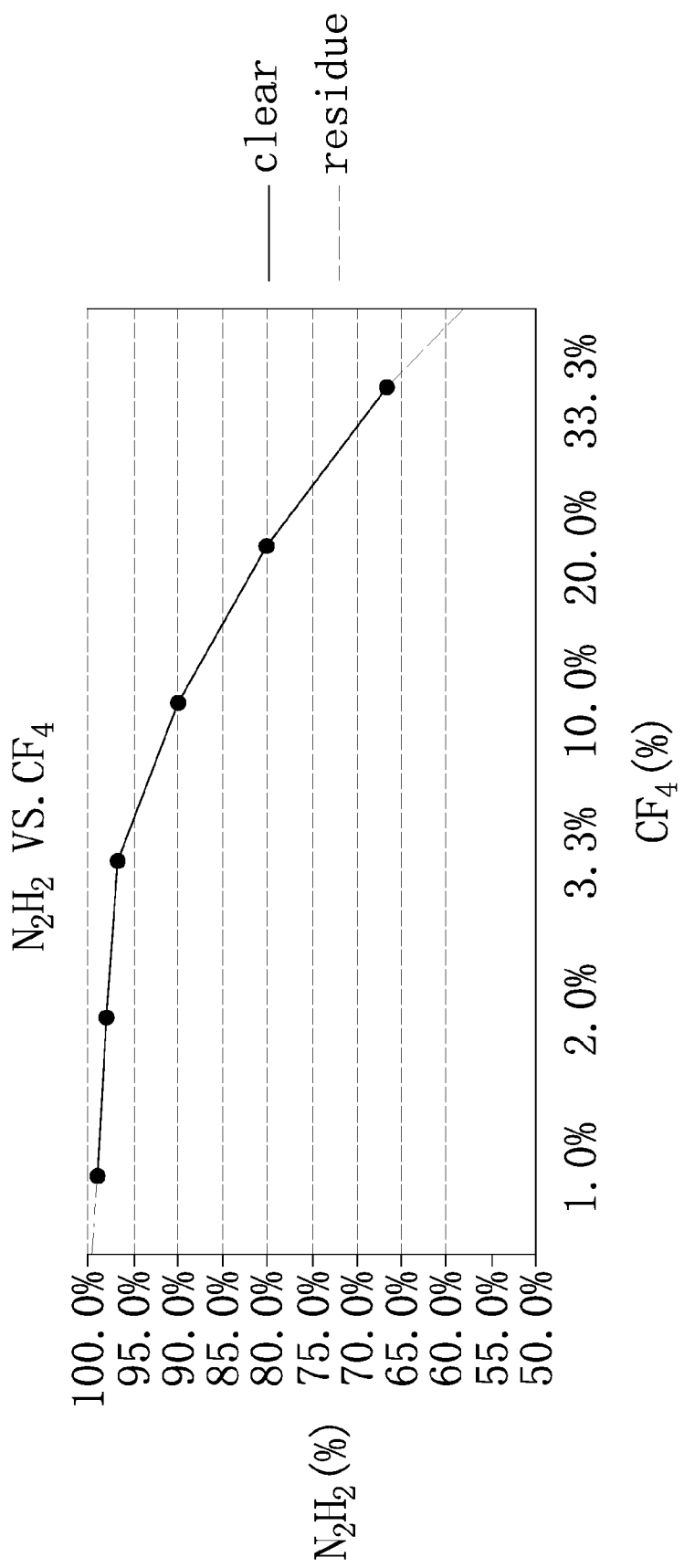
FIG. 4 is a linear plot diagram illustrating a ratio of $N_2H_2$ to $CF_4$ used in the second plasma etching process vs. amount of a residue of the adhesion layer in accordance with another embodiment of the present invention.

Thus, the inventors of the present invention discover not only that the plasma simultaneously including $N_2H_2$ and $CF_4$ can be used for effectively etching and removing the adhesion layers 240, 341, 343, 345, but also the etching rate of the second plasma etching process is adjustable by adjusting a ratio of $N_2H_2$ to $CF_4$, so that the base structures 220, 320 can be prevented from damaging by $CF_4$ and the organosilane can be removed completely. Please refer to FIG. 4. FIG. 4 is a linear plot diagram illustrating a ratio of $N_2H_2$ to $CF_4$ used in the second plasma etching process vs. amount of a residue of the adhesion layer in accordance with another embodiment of the present invention. It can be seen in FIG. 4 that a ratio of the second nitrogen-based gas (e.g. $N_2H_2$) used in the second plasma etching process for etching the adhesion layer made of organosilane to the fluorine-based gas (e.g. $CF_4$) ranges from 99:1 to 2:1. And it can also be seen in FIG. 4 that the adhesion layer made of organosilane can be removed completely in the above gas ratio ranges (as shown in FIG. 4, a solid line means (indicates or exemplifies) that the adhesion layer are removed completely, a dashed line means that a residue are still remained or left behind). In addition, nitrogen hydrides, such as $N_2H_4$, $N_2H_6$, or $NH_3$, can be used for replacing the $N_2H_2$ in accordance with a process requirement. Furthermore, fluorocarbon compounds, such as $C_4F_8$ or $C_5F_8$, can be used for replacing $CF_4$ in accordance with a process requirement.

Additional item worthy of mentioning is that a proportion of $CF_4$ of the second mixed gases used in the second plasma etching process can be increased for etching the MEMS devices including the adhesion layer 240 only arranged on the surface layer (as shown in FIG. 2A), for example, the ratio of $N_2H_2$ to $CF_4$ is 10:1. However, because of the adhesion layer 343 is arranged between the intermediate layer 324 and the surface layer 326 of the base structure 320, as well as the adhesion layer 345 is arranged between the sacrificial structure 330 and the surface layer 326, not arranged only on the surface layer of the base structure 320, so a proportion of $CF_4$ of the second mixed gases may be reduced for etching the MEMS devices including the sacrificial structure being a sandwich structure (as shown in FIG. 3A), so as to prevent excessive etching rate resulting from excessive $CF_4$ from damaging the more intricate base structure 320 (such as the strip parts L1 and the intermediate layer 324). Therefore, the ratio of $N_2H_2$ to $CF_4$ is 30:1 for instance. Thus, in view of different etching tolerances of different MEMS devices with different base structures, the ratio of the second nitrogen-base gas to the fluorine-based gas used in the second plasma etching process can be adjusted properly to obtain a property plasma etching rate. Besides, the properly etching rate of the second plasma etching process can be used not only for removing the adhesion layer effectively and synchronically removing the remaining sacrificial structure after completely the first plasma etching process, but also for maintaining the integrity of the base structure.

In summary, according to the etching method for manufacturing MEMS devices provided in the present invention, the plasma including the first mixed gas including $O_2$ and the nitrogen-based gas (e.g. $N_2H_2$) is used for etching the sacrificial structure made from Polyimide, and the plasma including the second mixed gas including the nitrogen-based gas (e.g. $N_2H_2$) and the fluorine-based gas (e.g. $CF_4$) is used for etching the adhesion layer made from Organosilane, so as to effectively remove Polyimide and Organosilane and prevent the residues thereof from remaining on the base structure and reducing the yield of the MEMS devices.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An etching method for manufacturing MEMS devices, comprising:
   providing a substrate including a first surface and a second surface opposite to the first surface,
   arranging a base structure, a sacrificial structure and at least one adhesion layer on the first surface of the substrate, wherein the adhesion layer is disposed between the base structure and the sacrificial structure, the base structure is disposed between the adhesion layer and the substrate;
   performing a surface grinding process on the second surface of the substrate;
   performing a first plasma etching process by using a first mixed gas to remove the sacrificial structure, wherein the first mixed gas comprising oxygen and a first nitrogen-based gas; and
   performing a second plasma etching process by using a second mixed gas to remove the adhesion layer, wherein the second mixed gas includes a second nitrogen-based base gas and a fluorine-based gas.

2. The etching method for manufacturing the MEMS devices according to claim 1, wherein the sacrificial structure has a material of Polyimide.

3. The etching method for manufacturing the MEMS devices according to claim 1, wherein the adhesion layer has a material of organosilane.

4. The etching method for manufacturing the MEMS devices according to claim 1, wherein the first nitrogen-based gas and the second nitrogen-based gas are gases respectively selected from a group including a nitrogen gas, nitrogen hydrides and a mixture thereof.

5. The etching method for manufacturing the MEMS devices according to claim 4, wherein nitrogen hydride is a gas selected from a group including $N_2H_2$, $N_2H_4$, $N_2H_6$, and $NH_3$.

6. The etching method for manufacturing the MEMS devices according to claim 1, wherein the fluorine-based gas has a composition of fluorocarbon.

7. The etching method for manufacturing the MEMS devices according to claim 1, wherein the fluorine-based gas is a gas selected from a group including carbon tetrafluoride ($CF_4$), octafluorocyclobutane ($C_4F_8$) or octafluorocyclopentene ($C_5F_8$) and a mixture thereof.

8. The etching method for manufacturing the MEMS devices according to claim 1, wherein a ratio of the second nitrogen-based gas to the fluorine-based gas ranges from 99:1 to 2:1.

9. The etching method for manufacturing the MEMS devices according to claim 1, wherein a ratio of oxygen to the first nitrogen-based gas of the first mixed gas ranges from 1:5 to 1:30.

10. The etching method for manufacturing the MEMS devices according to claim 1, further comprising:
   performing a backside etching process on the second surface to form a recess after performing the surface grinding process on the second surface of the substrate, and then performing the first plasma etching process to remove the sacrificial structure.

11. The etching method for manufacturing the MEMS devices according to claim 1, wherein the sacrificial structure is a sandwich structure.

12. The etching method for manufacturing the MEMS devices according to claim 11, wherein the at least one adhesion layer is a plurality of adhesion layers, the base structure includes a bottom layer, an intermediate layer, and a surface layer, the bottom layer is in contact with the first surface, the intermediate layer includes at least one through hole, the surface layer includes a plurality of through holes and discontinuous strip parts, the sacrificial structure is disposed between the bottom layer and the intermediate layer and between the surface layer and the intermediate layer, as well as further arranged in the through holes and arranged to cover the surface layer to form a sandwich structure, the adhesion layers are disposed between the sacrificial structure and a surface of the bottom layer away from the first surface, between the sacrificial structure and a surface of the intermediate layer away from the first surface, as well as disposed between the sacrificial structure and a surface of the surface layer away from the first surface of the substrate, respectively.

\* \* \* \* \*